(12) United States Patent
Chang et al.

(10) Patent No.: US 11,466,674 B2
(45) Date of Patent: Oct. 11, 2022

(54) AIR FLOW GENERATING DEVICE

(71) Applicant: Wistron Corporation, New Taipei (TW)

(72) Inventors: Shou-Lun Chang, New Taipei (TW); Chun Wang, New Taipei (TW); Gang Li, New Taipei (TW); Dongxu Tan, New Taipei (TW)

(73) Assignee: Wistron Corporation, New Taipei (TW)

( * ) Notice: Subject to any disclaimer, the term of this patent is extended or adjusted under 35 U.S.C. 154(b) by 78 days.

(21) Appl. No.: 17/153,834

(22) Filed: Jan. 20, 2021

(65) Prior Publication Data

US 2021/0140422 A1 May 13, 2021

Related U.S. Application Data

(63) Continuation of application No. 15/869,080, filed on Jan. 12, 2018, now abandoned.

(30) Foreign Application Priority Data

Dec. 7, 2017 (CN) .......................... 201711287764.3

(51) Int. Cl.
*F04B 45/047* (2006.01)
*F04D 25/08* (2006.01)
(Continued)

(52) U.S. Cl.
CPC .......... *F04B 45/047* (2013.01); *F04B 39/102* (2013.01); *F04D 25/08* (2013.01);
(Continued)

(58) Field of Classification Search
CPC ..... F16K 7/12; F16K 7/14; F16K 7/17; F16K 15/148; F04B 53/1037; F04B 39/102;
(Continued)

(56) References Cited

U.S. PATENT DOCUMENTS

| 893,420 A | 7/1908 | Barclay |
| 2003/0177899 A1 | 9/2003 | Monson |

(Continued)

FOREIGN PATENT DOCUMENTS

| CN | 101285459 A | 10/2008 |
| CN | 101589233 A | 11/2009 |

(Continued)

*Primary Examiner* — Kenneth J Hansen
*Assistant Examiner* — Benjamin Doyle
(74) *Attorney, Agent, or Firm* — Winston Hsu

(57) ABSTRACT

An air flow generating device includes an enclosing wall, a frame sheet, a cover film, and a vibrating part. The frame sheet is disposed inside an air flow passage formed by the enclosing wall and closely contacts the air flow passage by its periphery. The cover film includes a central connection portion fixed to a central portion of the frame sheet, and a plurality of movable cover portions connected to the central connection portion. The cover film is between the frame sheet and an outlet of the air flow passage. The movable cover portions selectively cover a plurality of through holes of the frame sheet. The vibrating part is fixed on the frame sheet. When the vibrating part vibrates, the central portion (Continued)

and the central connection portion move together with the vibrating part so that the movable cover portions seal the through holes or move relative to the through holes.

6 Claims, 10 Drawing Sheets

(51) Int. Cl.
*F04F 5/16* (2006.01)
*G06F 1/20* (2006.01)
*F04B 39/10* (2006.01)
*F04D 33/00* (2006.01)
*H05K 7/20* (2006.01)

(52) U.S. Cl.
CPC .............. *F04D 33/00* (2013.01); *F04F 5/16* (2013.01); *G06F 1/203* (2013.01); *G06F 1/206* (2013.01); *H05K 7/206* (2013.01)

(58) Field of Classification Search
CPC ...... F04B 43/046; F04B 43/04; F04B 45/047; F04B 17/003; F04B 43/028; F04B 45/04; F04B 53/10; F04B 43/0054; F04B 43/043; F04B 43/095; F04B 49/06; D06F 75/14; F04D 25/08; F04D 33/00; F04F 5/16; F04F 7/00; G06F 1/20; G06F 1/203; G06F 1/206; H05K 1/0272; H05K 7/20154; H05K 7/20172; H05K 7/20409; H05K 7/206; H05K 7/20918
USPC ..................... 137/854, 855, 856, 857, 858
See application file for complete search history.

(56) References Cited

U.S. PATENT DOCUMENTS

| | | | | |
|---|---|---|---|---|
| 2008/0304979 | A1* | 12/2008 | Lucas | F04B 45/04 417/327 |
| 2009/0148318 | A1* | 6/2009 | Kamitani | F04B 45/04 417/413.2 |
| 2009/0148320 | A1* | 6/2009 | Lucas | F04B 43/046 417/481 |
| 2010/0074775 | A1* | 3/2010 | Yamamoto | F04B 43/046 417/413.2 |
| 2010/0150753 | A1 | 6/2010 | Busch | |
| 2011/0076170 | A1* | 3/2011 | Fujisaki | F04B 45/047 417/415 |
| 2011/0296722 | A1* | 12/2011 | Lukas | F04B 43/095 38/77.1 |
| 2013/0008545 | A1 | 1/2013 | Chan | |
| 2013/0323085 | A1* | 12/2013 | Hirata | F04B 43/046 417/413.1 |
| 2015/0322954 | A1 | 11/2015 | Tian | |
| 2016/0377072 | A1* | 12/2016 | Wu | F04B 53/10 417/53 |
| 2017/0138357 | A1 | 5/2017 | Kondo | |
| 2017/0218936 | A1 | 8/2017 | Chen | |

FOREIGN PATENT DOCUMENTS

| | | |
|---|---|---|
| CN | 101778552 A | 7/2010 |
| CN | 102313265 A | 1/2012 |
| CN | 103814217 A | 5/2014 |
| CN | 105159424 A | 12/2015 |
| CN | 205729763 U | 11/2016 |
| JP | 2010-230015 A | 10/2010 |
| TW | 200706819 | 2/2007 |
| TW | I416044 | 11/2013 |

* cited by examiner

AIR FLOW GENERATING DEVICE

CROSS REFERENCE TO RELATED APPLICATIONS

This is a continuation application of U.S. patent application Ser. No. 15/869,080, filed Jan. 12, 2018, the entire contents of which is incorporated herein by reference.

BACKGROUND OF THE INVENTION

1. Field of the Invention

The invention relates to an air flow generating device, and especially relates to an air flow generating device that does not use blades but reciprocating motion for generating air flow.

2. Description of the Prior Art

For heat dissipation of common electronic devices, fans with rotatory blades are involved in the heat dissipation. The common electronic devices exchange heat with an environment by forced convection induced by rotating the rotatory blades. The fans with rotatory blades still need a certain installation space even if the fans with rotatory blades are miniaturized. The fans with rotatory blades are often used in the heat-dissipating systems of conventional notebooks. However, for thin notebooks, tablets, cellular phones, because the structure sizes of the devices are limited, it is difficult for the fans with rotatory blades to meet the requirements of the devices, resulting in difficulty in quickly dissipating heat produced by the devices in operation, so that the operation performance of the devices is impaired.

SUMMARY OF THE INVENTION

An aspect of the invention is to provide an air flow generating device, which uses vibrations of films to generate air pressure difference and coordinates with a one-way valve structure so as to generate a forced air flow that is capable of dissipating heat.

An air flow generating device according to the invention includes an enclosing wall, a frame sheet, a cover film, and a vibrating part. The enclosing wall forms an air flow passage. The air flow passage has an inlet and an outlet. The frame sheet is disposed in the air flow passage and has a plurality of through holes. The periphery of the frame sheet closely contacts the enclosing wall. The frame sheet partitions the air flow passage into a first air cavity connecting with the outlet, and a second air cavity connecting with the inlet. The cover film includes a central connection portion and a plurality of movable cover portions connected to the central connection portion. The cover film is located between the frame sheet and the outlet. The central connection portion is fixed on a central portion of the frame sheet. The movable cover portions selectively cover the through holes. The vibrating part is fixedly connected to the frame sheet and can repetitively move. Therein, when the vibrating part moves in a first direction toward the first air cavity, the central portion of the frame sheet and the central connection portion move in the first direction move so that the movable cover portions seal the through holes, push air in the first air cavity out through the outlet, and draw in external air from the inlet. When the vibrating part moves in a second direction opposite to the first direction toward the second air cavity, the central connection portion of the cover film and at least the central portion of the frame sheet move in the second direction so that the movable cover portions lift in the first direction relative to the through holes so as to make at least a portion of the external air enter the first air cavity from the second air cavity. Thereby, the movable cover portions and the through holes produce open and close statuses by use of the vibration of the vibrating part, so as to generate an air flow that flows in the air flow generating device through the inlet, passes through the air flow passage, and flows out the air flow generating device through outlet. Accordingly, the air flow can be used to dissipate heat.

Compared with the prior art, the air flow generating device of the invention does not use blades for generating the air flow, so the device volume of the air flow generating device needs a smaller installation space than conventional fans with rotatory blades, so that the air flow generating device is applicable to the heat-dissipating systems of thin notebooks, tablets, cellular phones and can enhance the performance of heat dissipation and improve the operation performance thereof.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
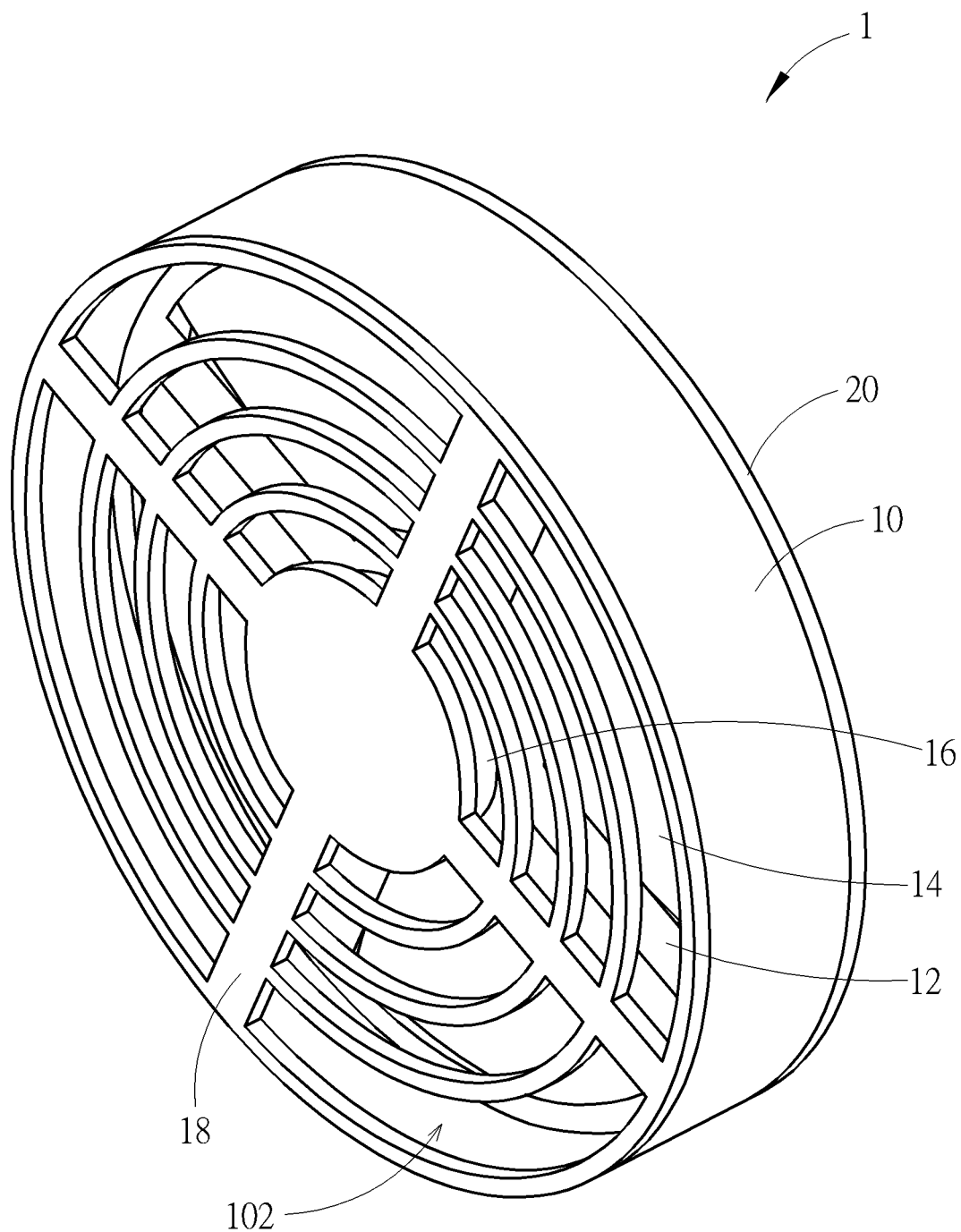
FIG. 1 is a schematic diagram illustrating an air flow generating device according to an embodiment.
Figure 2:
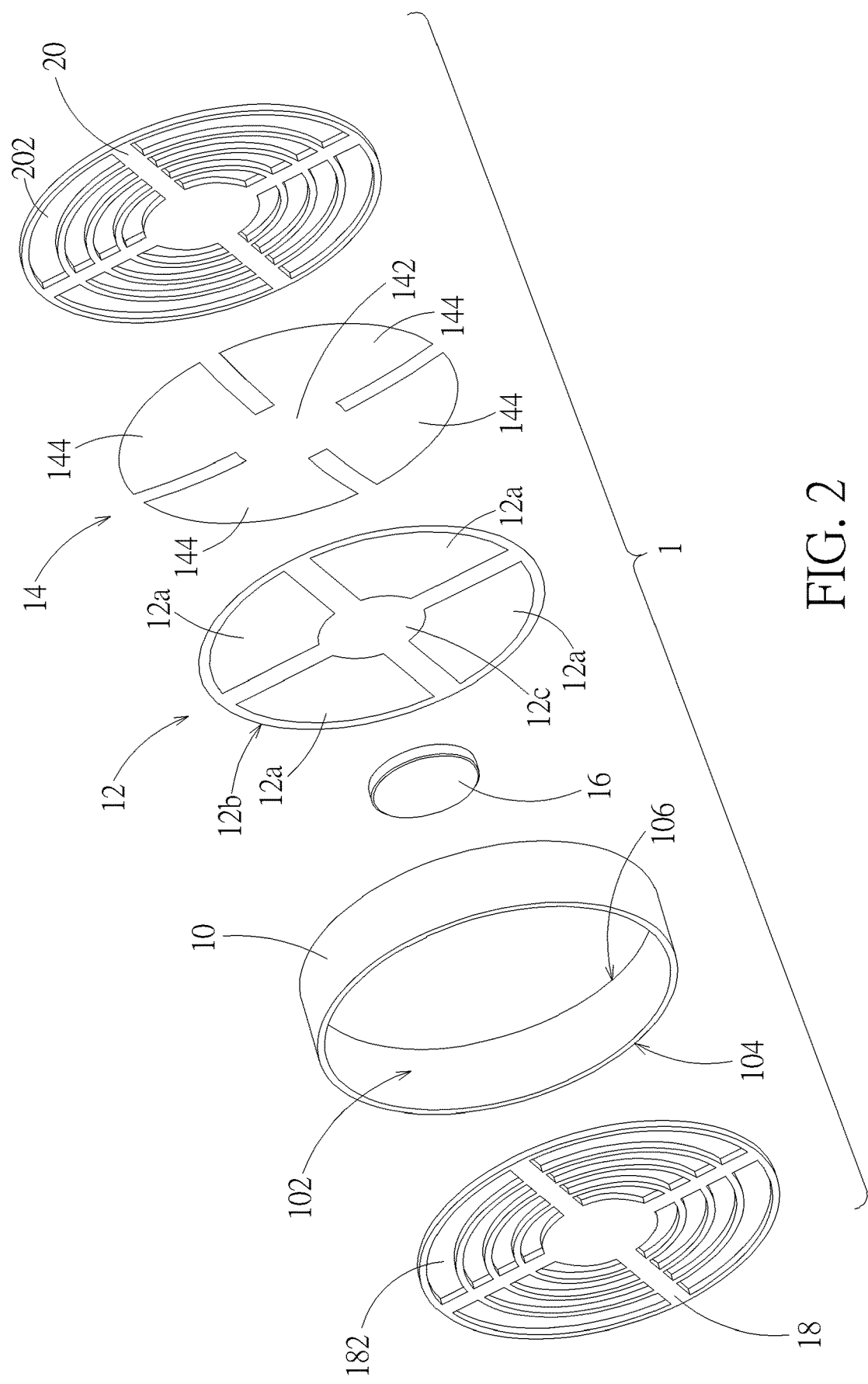
FIG. 2 is an exploded view of the air flow generating device in FIG. 1.

Please refer to FIG. 1 to FIG. 4. An air flow generating device 1 of an embodiment according to the invention includes an enclosing wall 10, a frame sheet 12 (shown in an enlarged scale in the sectional views), a first cover film 14 (shown in an enlarged scale in the sectional views), and a vibrating part 16. The enclosing wall 10 forms an air flow passage 102 and has a first opening 104 and a second opening 106. The air flow passage 102 has one or more inlets 102a and one or more outlets 102b. Therein, the first opening 104 includes the inlet 102a. The second opening 106 includes the outlet 102b. The frame sheet 12 is disposed in the air flow passage 102 and has a plurality of first through holes 12a. The periphery 12b of the frame sheet 12 closely contacts the inner wall of the enclosing wall 10 or is fixed thereto. The first cover film 14 includes a first central connection portion 142 and a plurality of first movable cover portions 144 that are connected to the first central connection portion 142 and are disposed corresponding to the first through holes 12a respectively. The first cover film 14 is located between the frame sheet 12 and the outlet 102b. The first central connection portion 142 is fixed to a central portion 12c of the frame sheet 12 (e.g. by a hot-melt join, or adhesive). The first movable cover portions 144 can selectively cover the first through holes 12a. The vibrating part 16 (of which connection wires to an external power source are indicated by dashed lines in FIG. 3) is fixedly connected to the frame sheet 12 and is used for producing reciprocating motion in a single axis. In the embodiment, the vibrating part 16 can be a combination of a permanent magnet and an electromagnet which uses the magnetic field produced by the electromagnet to make the permanent magnet repetitively move in the single axis so as to drive the movable cover portions 144, which are connected to the permanent magnet, to wiggle; however, the invention is not limited thereto. For example, the vibrating part 16 can include one or more piezoelectric sheet which can wiggle under a load of voltage so as to drive the movable cover portions 144, which are connected to the piezoelectric sheet, to wiggle. In practice, the enclosing wall 10 can be realized by but not limited to a round barrel. For example, the enclosing wall 10 can be provided with a square sectional profile. The frame sheet 12 and the first cover film 14 can be made of but not limited thereto polymers (e.g. polyester resin, polyethylene, polypropylene and so on) with a stamping process for forming their profiles. The frame sheet 12 and the first cover film 14 can be made of the same material or different materials. Both the frame sheet 12 and the first cover film 14 can be formed in a form of film, or only the first cover film 14 is formed in a form of film. In another embodiment, the frame sheet 12 and the first cover film 14 can be metal films.

Furthermore, the air flow generating device 1 further includes a lower support 18 and an upper support 20. The lower support 18 and the upper support 20 are disposed at the first opening 104 and the second opening 106 respectively (i.e. located at the inlet 102a and the outlet 102b respectively) and are fixedly connected to the enclosing wall 10, which is conducive to the maintenance of the structure of the enclosing wall 10 and is also conducive to enhancement of the whole structural strength of the air flow generating device 1. In addition, in the embodiment, both the lower support 18 and the upper support 20 are formed by a plurality of concentric circles which are connected by several ribs; however, the lower support 18 and the upper support 20 can be formed in other structures in practice. For example, lower support 18 and the upper support 20 can be formed by a disk with a plurality of through holes 182 and 202 formed thereon for air (e.g. air) to flow through. Furthermore, one of the lower support 18 and the upper support 20 can be structurally integrated with the enclosing wall 10 into one piece, e.g. by a drawing process on a metal plate to form a cup structure. In the embodiment, the air flow passage 102 in the air flow generating device 1 between the lower support 18 and the upper support 20 is divided by the first cover film 14 and the frame sheet 12 into an upper air cavity A and a lower air cavity B.

Figure 3:
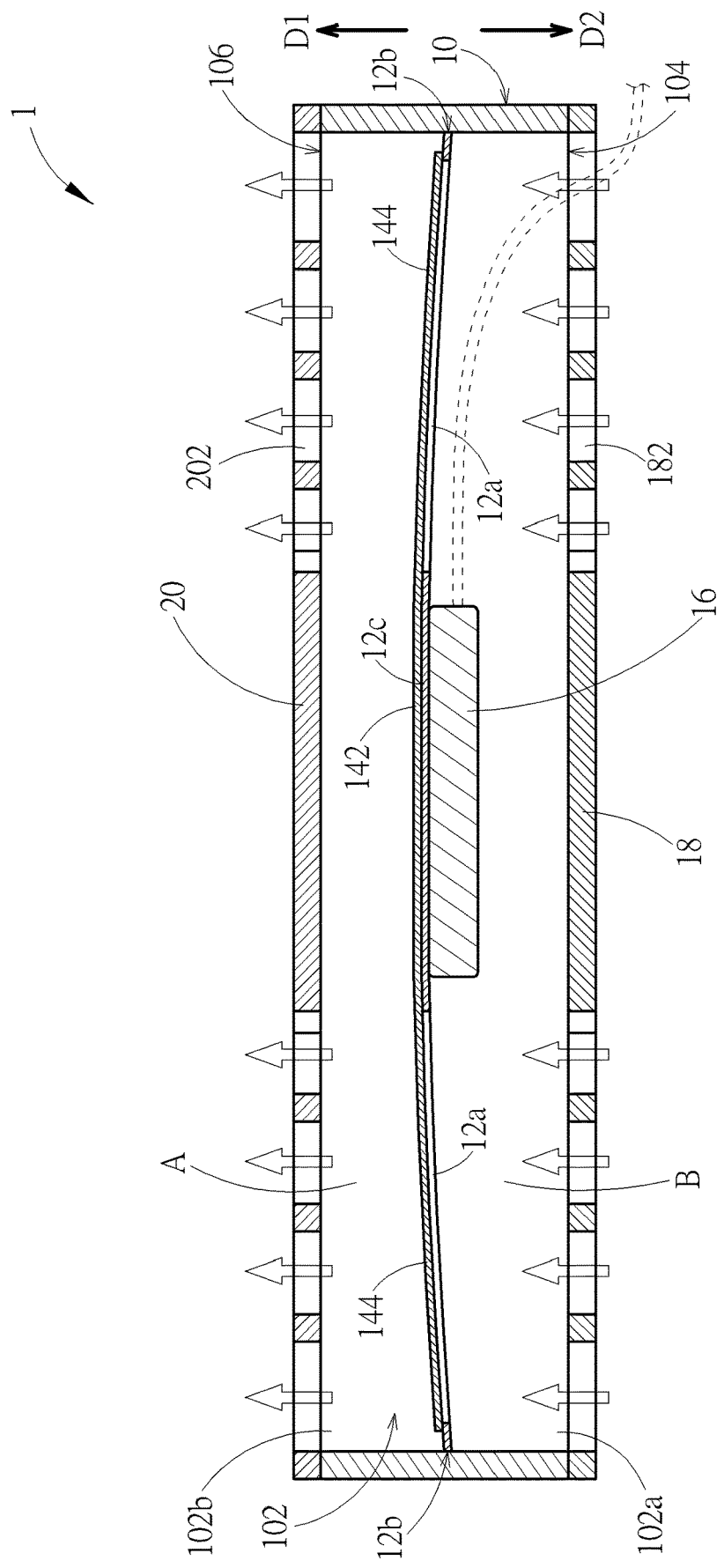
FIG. 3 is a sectional view of the air flow generating device in FIG. 1 along the line X-X, of which a vibrating part moves in a first direction.

When the vibrating part 16 moves in a first direction D1 toward the upper air cavity A (as shown by FIG. 3, in which the vibrating part 16 is located at an upper position of the vibration in the view point of FIG. 3), the central portion 12c of the frame sheet 12 and the first central connection portion 142 of the first cover film 14 also move in the first direction D1, so that the first movable cover portions 144 seal the first through hole 12a; therein, the frame sheet 12 shows an upward-protruding status in FIG. 3. In the view point of FIG. 3, in the process that the vibrating part 16 vibrates upward (i.e. move in the first direction D1), the air in the upper air cavity A is compressed so as to make the air pressure of the air in the upper air cavity A be higher than that of the air in the lower air cavity B, so that the frame sheet 12 and the first cover film 14 suffer downward resistance by the air in the upper air cavity A. The resistance will make the first movable cover portions 144 tend to be closely attached to the periphery of the first through holes 12a, resulting in an effect of sealing the first through holes 12a, or closing the first through holes 12a.

Furthermore, in the process that the vibrating part 16 vibrates upward, the moving toward the upper air cavity A of the frame sheet 12 and the first cover film 14 (or the moving of the frame sheet 12 driving the first cover film 14 to protrude upward together) will push the air above the frame sheet 12 in the upper air cavity A, so that the air above the frame sheet 12 in the upper air cavity A blows out the enclosing wall 10 through the outlet 102b to form a stronger air flow (indicated by hollow arrows in FIG. 3). At the same time, the upward moving of the frame sheet 12 and the first cover film 14 will also expand the lower air cavity B below the frame sheet 12, so that the air pressure of the air in the lower air cavity B is lower than the atmospheric pressure below the lower support 18, which drives the air below the lower support 18 to be drawn into the lower air cavity B through the inlet 102a (indicated by hollow arrows in FIG. 3).

Figure 4:
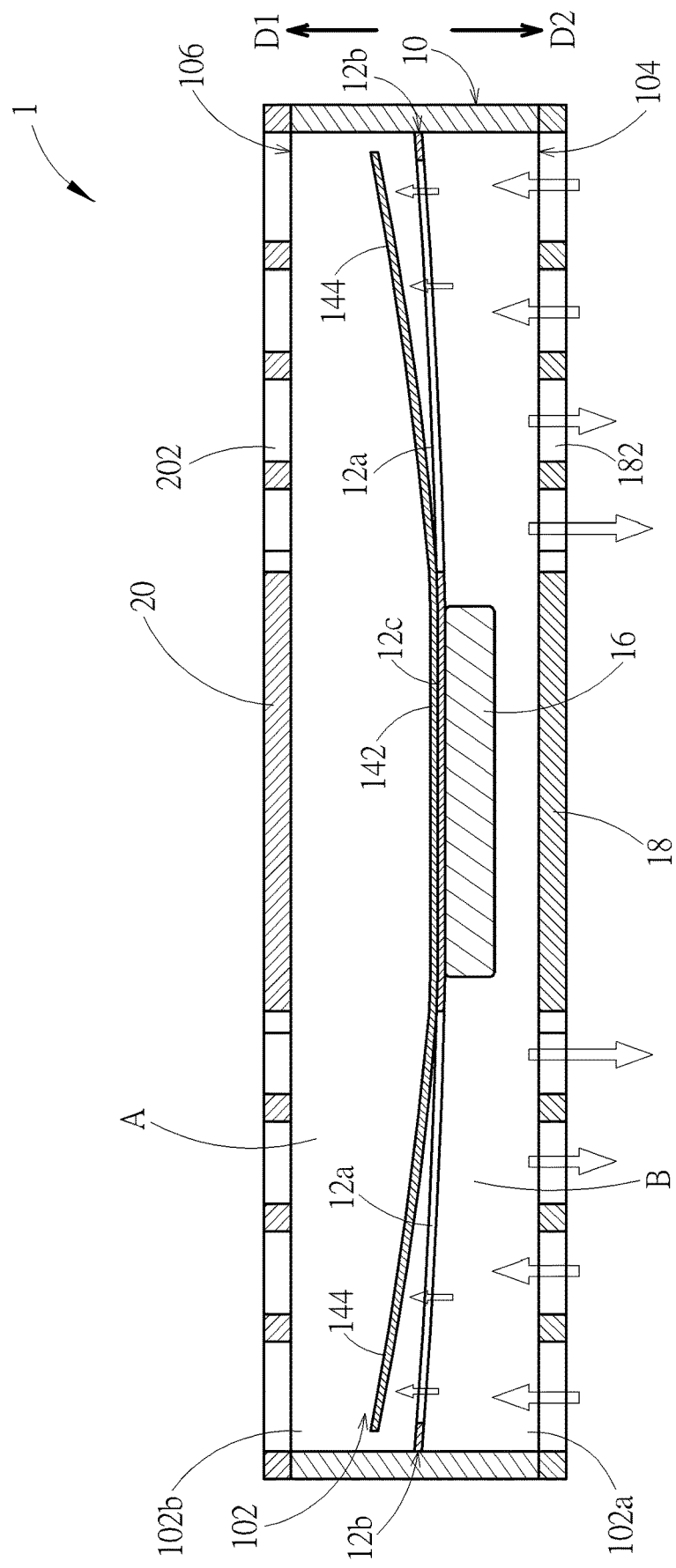
FIG. 4 is a sectional view of the air flow generating device in FIG. 1 along the line X-X, of which the vibrating part moves in a second direction.

Furthermore, when the vibrating part 16 moves in a second direction D2 opposite to the first direction D1 toward the lower air cavity B (as shown by FIG. 4, in which the vibrating part 16 is located at a lower position of the vibration in the view point of FIG. 4), the central portion 12c of the frame sheet 12 and the first central connection portion 142 of the first cover film 14 also move in the second direction D2, so that free ends of the first movable cover portions 144 move in the first direction D1 relative to the first through holes 12a, resulting in that the first movable cover portions 144 lift in the first direction D1 relative to the first through holes 12a; therein, the frame sheet 12 shows a downward-protruding status in FIG. 4. In the view point of FIG. 4, in the process that the vibrating part 16 vibrates downward (i.e. move in the second direction D2), the air in the lower air cavity B is compressed so as to make the air pressure of the air in the lower air cavity B be higher than that of the air in the upper air cavity A, so that the frame sheet 12 and the first cover film 14 suffer upward resistance by the air in the lower air cavity B. The resistance will make the free ends of the first movable cover portions 144 tend to depart away from the first through holes 12a (because only one end of the first movable cover portion 144 is fixed), resulting in an effect of opening the first through holes 12a. At the same time, a portion of the air in the lower air cavity B below the frame sheet 12 can enter the upper air cavity A above the frame sheet 12 through the first through holes 12a (indicated by hollow arrows in FIG. 4).

Therefore, in the embodiment, the structure formed by the frame sheet 12 and the first cover film 14 has an effect as a one-way valve. By the up and down reciprocating motion of the vibrating part 16, the air outside the enclosing wall 10 is constantly drawn into the enclosing wall 10 (or the air flow passage 102) from the inlet 102a, passes through the frame sheet 12 through the first through holes 12a, and then blows out the enclosing wall 10 from the outlet 102b. The flowing air forms a one-way and recurrent air flow. As long as the vibration frequency is high enough, the flowing air can form a continuous air flow that continuously blows from the enclosing wall 10. In practice, the air flow can be used for heat dissipation of electronic devices.

In addition, in the embodiment, the closely contacting of the periphery 12b of the frame sheet 12 with the inner wall of the enclosing wall 10 is achieved by fixedly connecting the periphery 12b of the frame sheet 12 on the enclosing wall 10 (e.g. by glue adhering), so that the periphery 12b of the frame sheet 12 and the enclosing wall 10 can be sealed therebetween and the periphery 12b of the frame sheet 12 can effectively separate the upper air cavity A and the lower air cavity B.

In addition, in the embodiment, the first movable cover portions 144 correspond to the first through holes 12a respectively, i.e. a one-to-one correspondence. However, in practice, the disposition can be modified to make one first movable cover portion 144 cover several first through holes 12a at the same time, so that the frame sheet 12 can reserve more structure for maintenance of structural strength in a certain degree. Furthermore, in the embodiment, the profile of each first movable cover portion 144 is larger than the profile of the corresponding first through hole 12a, so that when the frame sheet 12 moves upward, the first movable cover portion 144 can cover the corresponding first through hole 12a totally. In practice, even if the first movable cover portion 144 does not cover the corresponding first through hole 12a totally, the first movable cover portion 144 still can provide a covering effect in a certain degree, that is, so as to make the air flow generating device 1 generate an air flow. Furthermore, in the embodiment, each first movable cover portion 144 is formed in a circular sector; each first through hole 12a is formed in a circular sector, too. The first movable cover portions 144 are disposed radially relative to the first central connection portion 142. However, in practice, the movable cover portions 144 and the first through holes 12a can be formed in other profiles; besides, the disposition thereof is not limited to radial disposition. As long as the vibrating part 16 can transfer the vibration to the frame sheet 12 efficiently (i.e. making the frame sheet 12 produce an enough motion displacement or vibration amplitude to alternatively open and close the first through holes 12a), an air flow can be formed by the frame sheet 12 and the first cover film 14. Therefore, in practice, the vibrating part 16 can be fixed to other positions of the frame sheet 12 (in which the farther the location of the vibrating part 16 away from the periphery 12b of the frame sheet 12 is, the larger the vibration amplitude is). In the embodiment, the vibrating part 16 is fixedly connected to the central portion 12c of the frame sheet 12, so that the frame sheet 12 suffers balance vibration.

Figure 5:
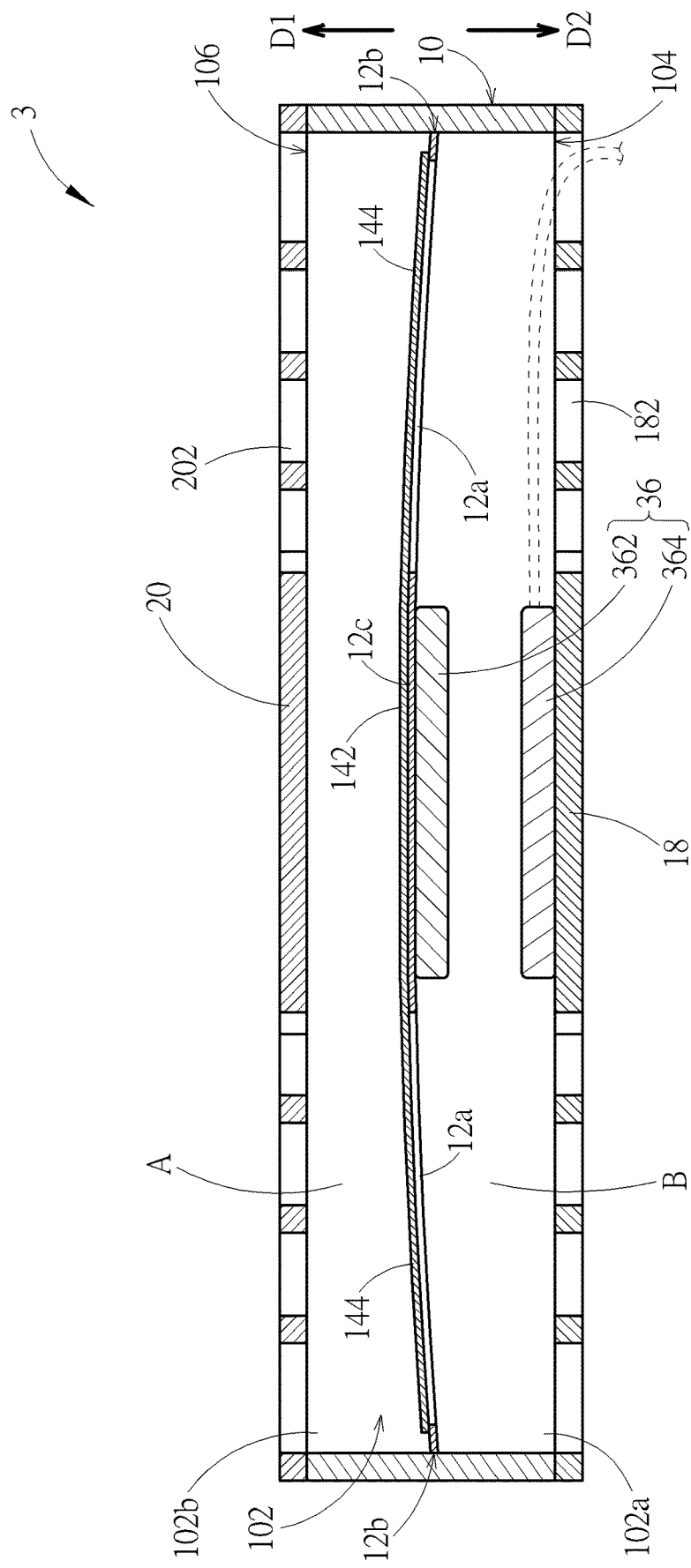
FIG. 5 is a sectional view of an air flow generating device according to another embodiment.

In the embodiment, the vibrating part 16 is achieved by a single part; however, in practice, the vibrating part 16 can be achieved by several separate components which work in cooperation with each other to vibrate the frame sheet 12 and the first cover film 14. Please refer to FIG. 5, which is another sectional view of an air flow generating device 3 according to another embodiment, of which the location of the cutting plane refers to the line X-X in FIG. 1. The air flow generating device 3 and the air flow generating device 1 are structurally similar. Therefore, the air flow generating device 3 still uses the reference numbers used in the air flow generating device 1. For other descriptions of the air flow generating device 3, please refer to the relevant descriptions of the air flow generating device 1 and the variants thereof, which will not be repeatedly described in addition. A main difference between the air flow generating device 3 and the air flow generating device 1 is that a vibrating part 36 of the air flow generating device 3 includes a magnet 362 and an electromagnet 364 (shown by a rectangle in FIG. 5). The magnet 362 is fixedly connected to the central portion 12c of the frame sheet 12. The electromagnet 364 is disposed on the lower support 18 opposite to the magnet 362. In the embodiment, the directions of the magnetic moments of the magnet 362 and the electromagnet 364 are parallel to the first direction D1 (or the second direction D2); however, the invention is not limited thereto in practice. When the coils of the electromagnet 364 (of which the connection wires to an external power source are indicated by dashed lines in FIG. 5) conduct alternating current, the electromagnet 364 and the magnet 362 alternatively form repulsion force and attraction force, so as to produce the repetitively moving in the first direction D1 and the second direction D2. Furthermore, in the embodiment, the strength of the lower support 18 is larger than the strength of the frame sheet 12, so that when the vibrating part 36 operates, the magnet 362 and the frame sheet 12 will produce a larger vibration (or vibration amplitude) relative to the enclosing wall 10. Thereby, the vibrating part 36 also can make the frame sheet 12 and the first cover film 14 act as the frame sheet 12 and the first cover film 14 of the air flow generating device 1 do, so that the air flow generating device 3 also can produce an air flow as the air flow generating device 1 does.

In addition, in practice, if the periphery 12b is disposed to slidably contact the enclosing wall 10, the periphery 12b and the enclosing wall 10 also can maintain airtight connection therebetween in a certain degree, so that when the magnet 362 vibrates, the frame sheet 12 vibrates together with the magnet 362 and the periphery 12b slides on the enclosing wall 10, so as also to generate an air flow like the above-mentioned description. Furthermore, the periphery 12b and the enclosing wall 10 therebetween can be filled with lubrication oil, which can enhance the airtightness between the periphery 12b and the enclosing wall 10 and further increase the contact area between the periphery 12b and the enclosing wall 10 so as to enhance the sliding stability of the periphery 12b on the enclosing wall 10.

Figure 6:
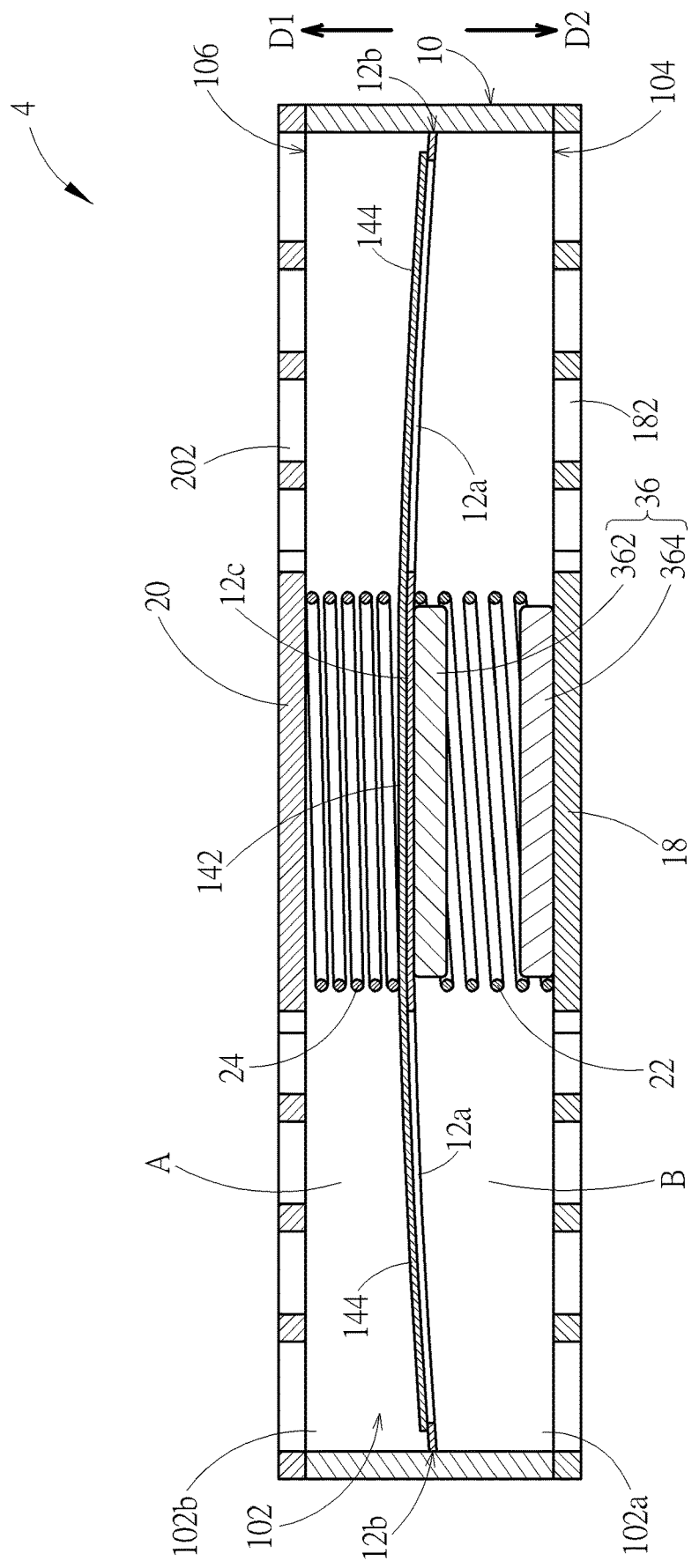
FIG. 6 is a sectional view of an air flow generating device according to another embodiment.

In addition, in practice, the electromagnet 364 and the magnet 362 can exchanged, which also can make the frame sheet 12 and the first cover film 14 act as the frame sheet 12 and the first cover film 14 of the air flow generating device 1 do. Furthermore, in practice, the vibrating part 36 can be disposed above the frame sheet 12. For example, the magnet 362 is fixed on the first central connection portion 142 of the first cover film 14 (i.e. fixedly connected to the central portion 12c of the frame sheet 12) while the electromagnet 364 is disposed on the upper support 20, which also can make the air flow generating device 3 generate an air flow. Furthermore, in practice, the frame sheet 12 and the first cover film 14 can be equipped with a spring for enhancing the efficiency of the vibration. As shown by FIG. 6, compared with the air flow generating device 3, the air flow generating device 4 further includes a lower spring 22 and an upper spring 24. The lower spring 22 is disposed between the frame sheet 12 and the lower support 18; in the embodiment, the two ends of the lower spring 22 abut against and between the central portion 12c of the frame sheet 12 and the lower support 18 (or between the magnet 362 and the electromagnet 364 in practice). When the vibrating part 36 vibrates, the lower spring 22 is elastically deformed. The upper spring 24 is disposed between the frame sheet 12 and the upper support 20; in the embodiment, the two ends of the upper spring 24 abut against and between the first central connection portion 142 and the upper support 20. When the vibrating part 36 vibrates, the upper spring 24 is elastically deformed. The lower spring 22 and the upper spring 24 also can be used in the air flow generating device 1, which will not be repeatedly described in addition.

Figure 7:
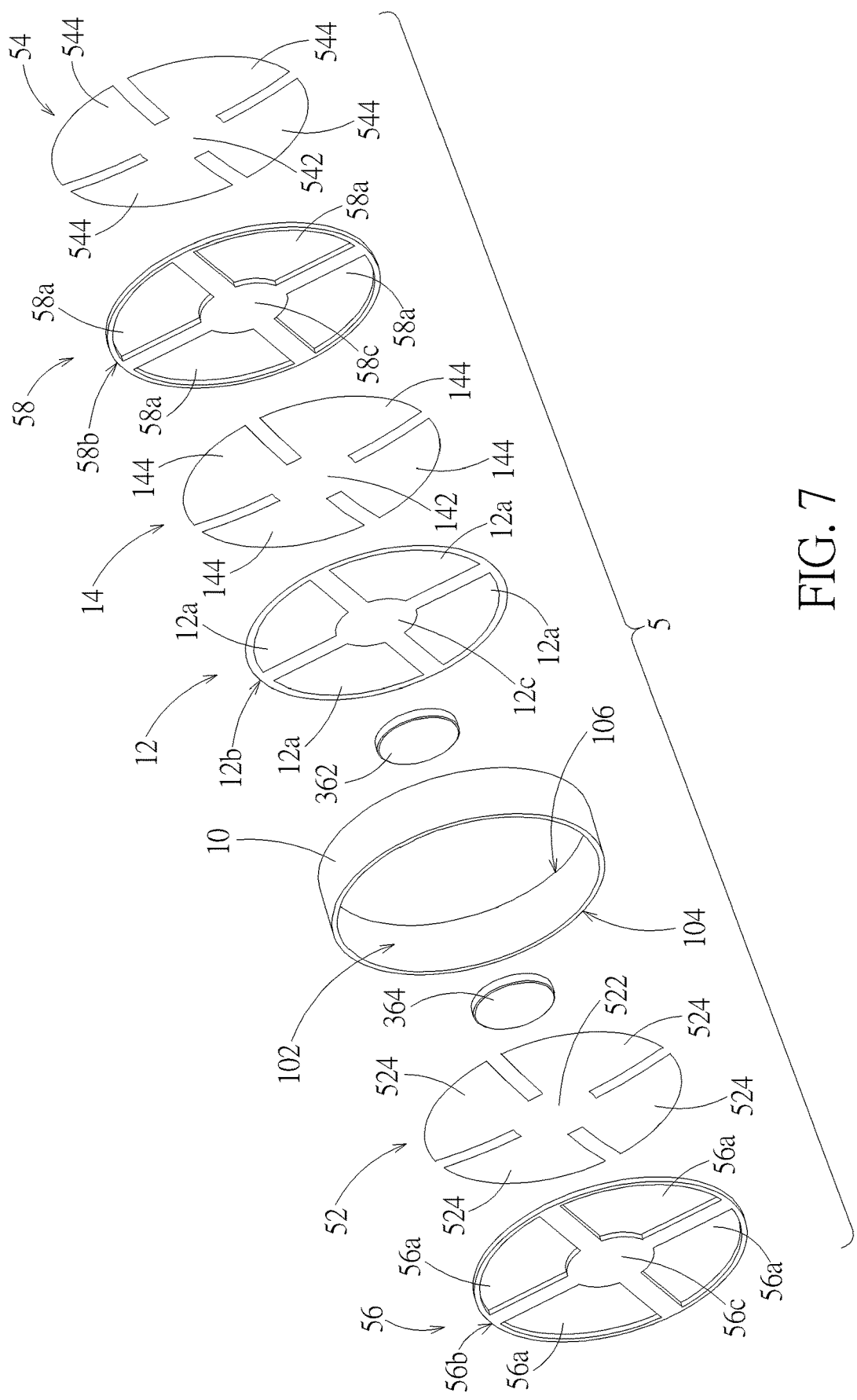
FIG. 7 is an exploded view of an air flow generating device according to another embodiment.

In the above embodiments, the air flow is driven mainly by the frame sheet 12 and the first cover film 14. The lower support 18 and the upper support 20 themselves do not have a valve function. However, in practice, the lower support 18 and the upper support 20 can be replaced with a structure having a valve function for enhancing the efficiency of generating the air flow. Please refer to FIG. 7 to FIG. 9, which are exploded and sectional views of an air flow generating device 5 according to another embodiment, of which the location of the cutting plane refers to the line X-X in FIG. 1. The air flow generating device 5 and the air flow generating device 3 are structurally similar. Therefore, the air flow generating device 5 still uses the reference numbers used in the air flow generating device 3. For other descriptions of the air flow generating device 5, please refer to the relevant descriptions of the air flow generating devices 1 and 3 and the variants thereof, which will not be repeatedly described in addition. Compared with the air flow generating device 3, the air flow generating device 5 further includes a second cover film 52 and a third cover film 54. The second cover film 52 is connected to the lower support 18 of the air flow generating device 5. The third cover film 54 is connected to the upper support 20 of the air flow generating device 5. In the embodiment, the profiles of the lower support 56 and the upper support 58 are different than the profiles of the lower support 18 and the upper support 20 of the air flow generating device 3. This is because the lower support 56 and the upper support 58 are required to cooperate with the second cover film 52 and the third cover film 54. However, in practice, if the second cover film 52 and the third cover film 54 can effectively cover the through holes of the lower support 18 and the upper support 20, the lower support 18 and the upper support 20 still can be used in the air flow generating device 5.

Further, the lower support 56 is fixedly connected to the enclosing wall 10 through its periphery 56b and is located at the inlet 102a. The lower support 56 has a plurality of second through holes 56a. The second cover film 52 includes a second central connection portion 522 and a plurality of second movable cover portions 524 connected to the second central connection portion 522. The second cover film 52 is located between the lower support 56 and the frame sheet 12. The second central connection portion 522 is fixed on a central portion 56c of the lower support 56. The second movable cover portions 524 cover the second through holes 56a. Furthermore, the upper support 58 is fixedly connected to the enclosing wall 10 through its periphery 58b and is located at the outlet 102b. The upper support 58 has a plurality of third through holes 58a. The third cover film 54 includes a third central connection portion 542 and a plurality of third movable cover portions 544 connected to the third central connection portion 542. The upper support 58 is located between the third cover film 54 and the first cover film 52. The third central connection portion 542 is fixed on a central portion 58c of the upper support 58. The third movable cover portions 544 cover the third through holes 58a. On the whole, the space inside the enclosing wall 10 (i.e. equivalent to the air flow passage 102) is divided into a lower air cavity B and an upper air cavity A by the lower support (together with the second cover film 52), the frame sheet 12 (together with the first cover film 14), and the upper support 58 (together with the third cover film 54).

Figure 8:
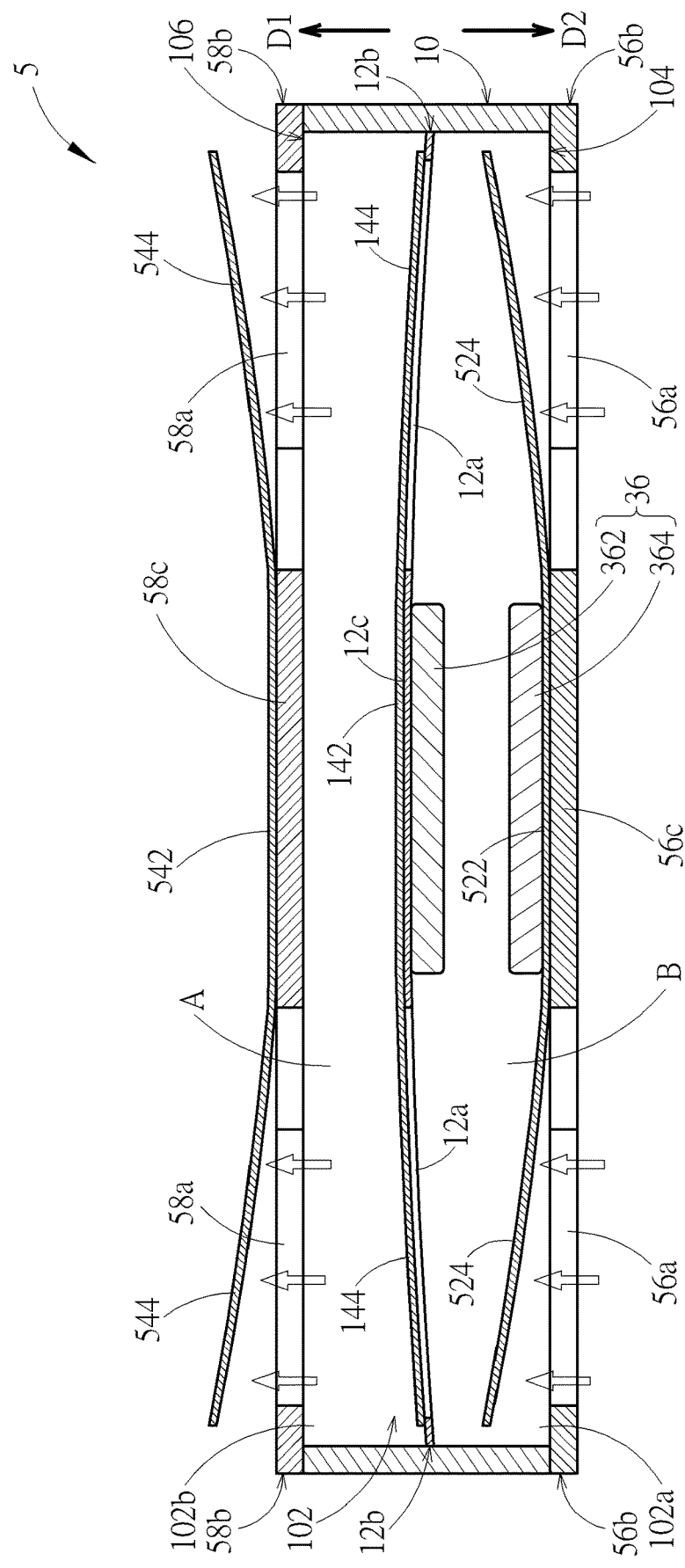
FIG. 8 is a sectional view of the air flow generating device in FIG. 7.

As shown by FIG. 8, when the magnet 362 of the vibrating part 36 moves in the first direction D1, the central portion 12c of the frame sheet 12 and the first central connection portion 142 of the first cover film 14 move in the first direction D1, so that the first movable cover portions 144 seal the first through holes 12a, free ends of the second movable cover portions 524 move in the first direction D1 relative to the second through holes 56a, and free ends of the third movable cover portions 544 move in the first direction D1 relative to the third through holes 58a. Therein, in the view point of FIG. 8, in the process that the magnet 362 of the vibrating part 36 vibrates upward, the air in the upper air cavity A above the frame sheet 12 is compressed by the frame sheet 12 (and the first cover film 14) so as to increase the air pressure of the air in the upper air cavity A (or decrease the volume of the upper air cavity A), so that the free ends of the third movable cover portions 544 lift in the first direction D1 relative to the third through hole 58a. Thereby, the air in the upper air cavity A can blow out the enclosing wall 10 through the third through holes 58a (indicated by hollow arrows in FIG. 8). Similarly, in the process that the magnet 362 of the vibrating part 36 vibrates upward, the lower air cavity B expands so as to decrease the air pressure of the air in the lower air cavity B, so that the second movable cover portions 524 lift in the first direction D1 relative to the second through holes 56a under the larger air pressure of the external air. Thereby, the external air can be drawn into the lower air cavity B through the second through holes 56a (indicated by hollow arrows in FIG. 8).

Figure 9:
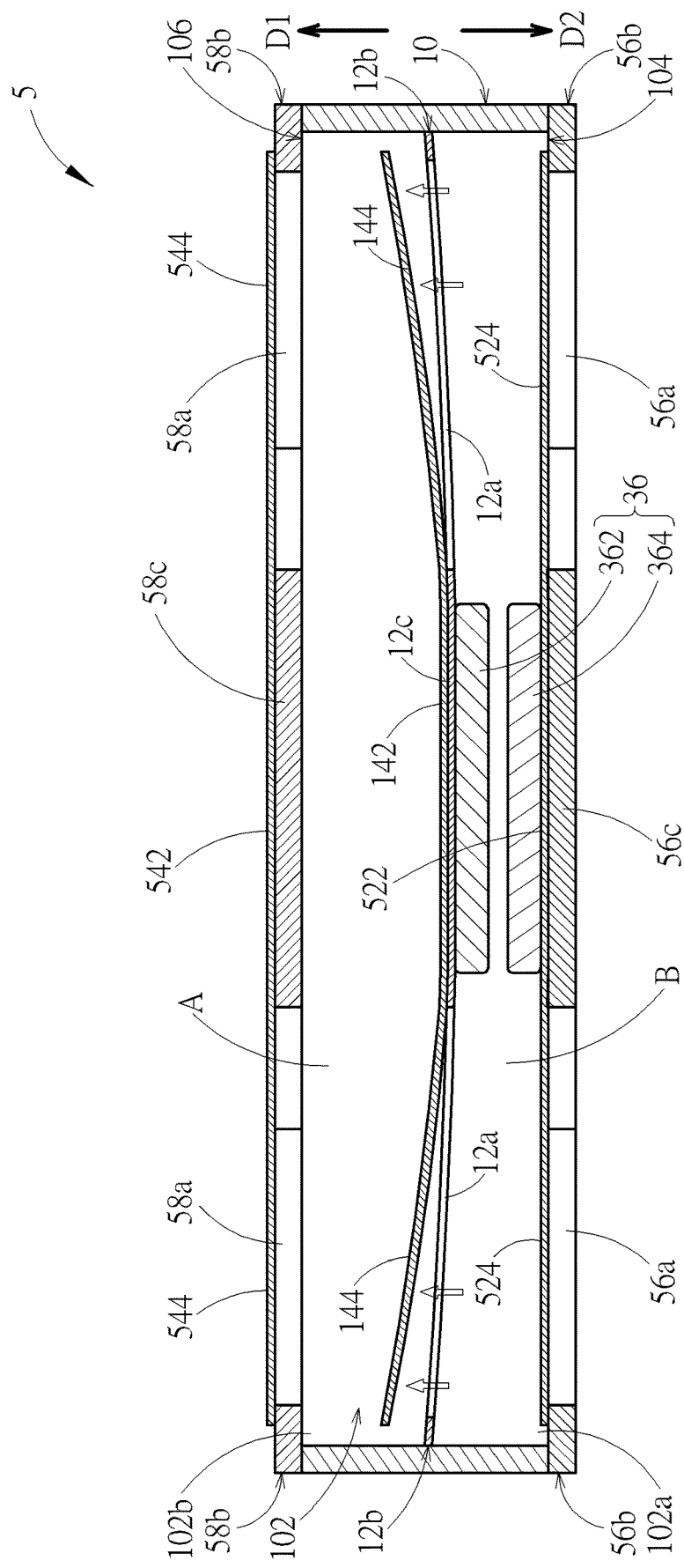
FIG. 9 is a sectional view of the air flow generating device in FIG. 8, of which the vibrating part moves in a second direction.

As shown by FIG. 9, when the magnet 362 of the vibrating part 36 moves in the second direction D2, the central portion 12c of the frame sheet 12 and the first central connection portion 142 of the first cover film 14 also move in the second direction D2, so that the free ends of the first movable cover portions 144 lift in the first direction D1 relative to the first through holes 12a, the second movable cover portions 524 seal the second through holes 56a, and the third movable cover portions 544 seal the third through holes 58a. Therein, in the view point of FIG. 9, in the process that the magnet 362 of the vibrating part 36 vibrates downward, the upper air cavity A expands so as to decrease the air pressure of the air in the upper air cavity A, so that the third movable cover portions 544 seal the third through holes 58a under the larger air pressure of the external air. Similarly, in the process that the magnet 362 of the vibrating part 36 vibrates downward, the lower air cavity B shrinks so as to the air pressure of the air in the lower air cavity B, so that the second movable cover portions 524 seal the second through holes 56a. In another aspect, when the magnet 362 of the vibrating part 36 moves in the second direction D2, the air pressure of the air in the upper air cavity A decreases and the air pressure of the air in the lower air cavity B increases, so that the first through holes 12a are opened, the second through holes 56a are closed, and the third through holes 58a are closed. That is, the air drawn in the air cavity B below the frame sheet 12 in FIG. 8 can enter the upper air cavity A above the frame sheet 12 through the first through holes 12a (indicated by hollow arrows in FIG. 9).

Furthermore, in the embodiment, the structure formed by the frame sheet 12 and the first cover film 14, the structure formed by the lower support 56 and the second cover film 52, and the structure formed by the upper support 58 and the third cover film 54 all have an effect as a one-way valve. By the up and down reciprocating motion of the magnet 362 and the vibrating part 36, the air flow generating device 5 can draw external air from the inlet 102a through the second through holes 56a into the lower air cavity B, push the drawn air to pass through the first through holes 12a of the frame sheet 12 into the upper air cavity A, and then blow the air in the upper air cavity A out from the outlet 102b through the third through holes 58a, resulting in an air flow.

In addition, in the embodiment, when the magnet 362 of the vibrating part 36 up and down moves, the lower support 56 and the upper support 58 (like the lower support 18 and the upper support 20) can keep their shape unchanged and are stiff in a certain degree, which is conducive to enhancement of the whole structural strength of the air flow generating device 5. However, in practice, the lower support 56 and the upper support 58 can be made of a membrane and are flexible like the frame sheet 12 so as to deform as the magnet 362 of the vibrating part 36 up and down moves. In this case, the lower support 56 and the upper support 58 will deform as the air pressures of the lower air cavity B and the upper air cavity A vary (relative to the external air pressure outside the enclosing wall 10).

Figure 10:
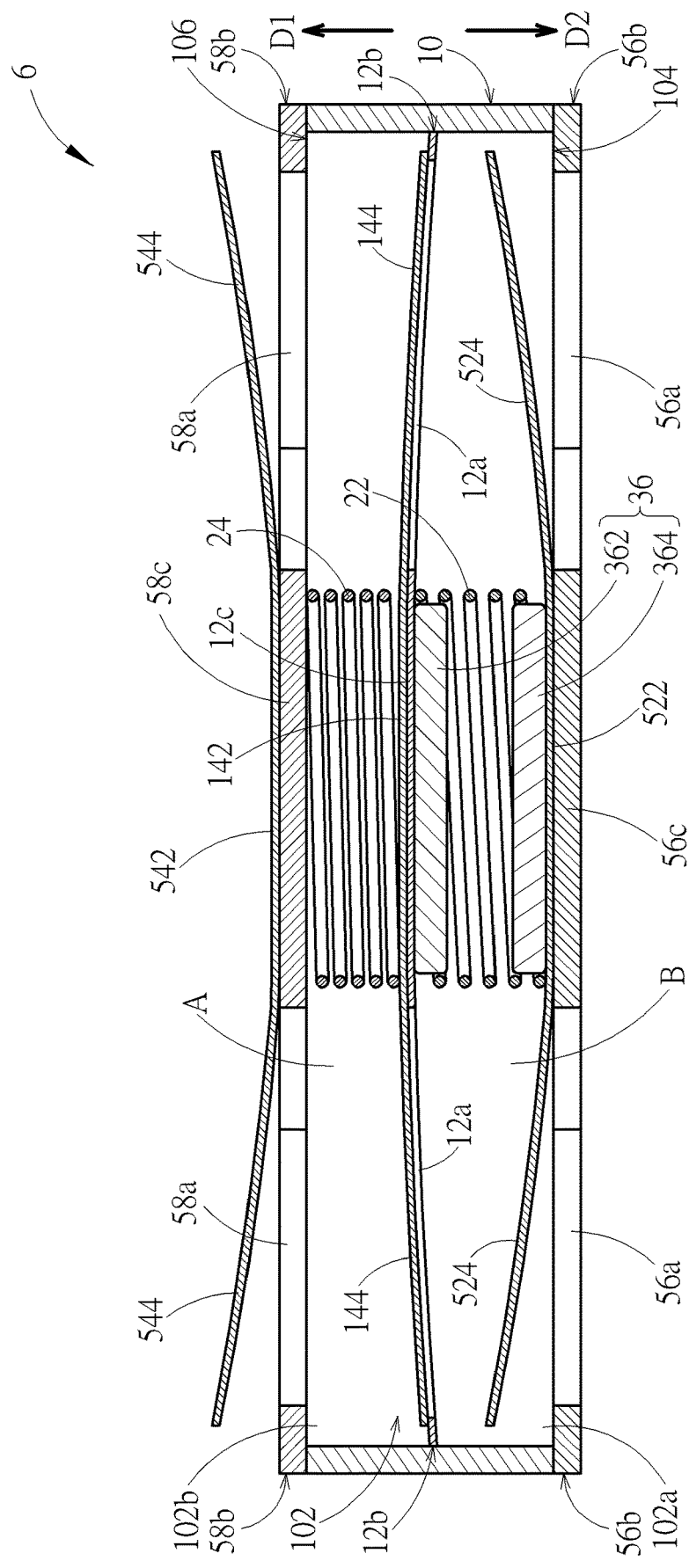
FIG. 10 is a sectional view of an air flow generating device according to another embodiment.

In addition, in practice, the air flow generating device 5 also can be equipped with the lower spring 22 and the upper spring 24 for enhancing the efficiency of the vibration. As shown by FIG. 10, compared with the air flow generating device 5, the air flow generating device 6 is equipped with the lower spring 22 and the upper spring 24. Therein, the lower spring 22 is disposed between the frame sheet 12 and the lower support 56. The upper spring 24 is disposed between the frame sheet 12 and the upper support 58. When the vibrating part 36 acts (i.e. making the magnet 362 vibrate), the lower spring 22 and the upper spring 24 elastically deform.

In addition, in practice, without changing the action of the components that are used to generate air flow (e.g. the frame sheet 12, the first cover film 14, the vibrating part 16 and so on), the air flow generating devices 1, 3, 4, 5 and 6 can include more supports disposed in the enclosing wall 10 (or the air flow passage 102) or at the first opening 104 or the second opening 106 for enhancing the structural strength of the whole devices.

Furthermore, in other embodiments, the air flow generating device 5 can includes only one of the second movable cover portions 524 and one of the third movable cover portions 544, besides the first cover film 14.

Thereby, compared with the prior art, the air flow generating device of the invention uses pressure difference produced by the reciprocating motion of a vibrating part in cooperation with a film and coordinates with a one-way valve structure so as to generate a forced air flow that is capable of dissipating heat, which is different from the conventional fans with rotatory blades. The device volume of the air flow generating device can be smaller than the conventional fans with rotatory blades, so that the air flow generating device is applicable to the heat-dissipating systems of thin notebooks, tablets, cellular phones and can enhance the performance of heat dissipation and improve the operation performance thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An air flow generating device, comprising:
an enclosing wall forming an air flow passage, the air flow passage having an inlet and an outlet;
a frame sheet disposed in the air flow passage and having a plurality of first through holes, a periphery of the frame sheet closely contacting the enclosing wall, the frame sheet partitioning the air flow passage into a first air cavity connecting with the outlet, and a second air cavity connecting with the inlet;
a first cover film comprising a first central connection portion and a plurality of first movable cover portions connected to the first central connection portion, the first cover film being located between the frame sheet and the outlet, the first central connection portion being fixed on a central portion of the frame sheet, the first movable cover portions selectively covering the first through holes;
a lower support fixedly connected to the enclosing wall and located at the inlet, the lower support having a plurality of second through holes;
a second cover film comprising a second central connection portion and a plurality of second movable cover portions connected to the second central connection portion, the second cover film being located between the lower support and the frame sheet, the second central connection portion being fixed on a central portion of the lower support, the second movable cover portions selectively covering the second through holes; and
a vibrating part fixedly connected to the frame sheet and being capable of repetitively moving;
wherein, when the vibrating part moves in a first direction toward the first air cavity, the first central connection portion of the first cover film and at least the central portion of the frame sheet move in the first direction, so that the first movable cover portions seal the first through holes and the second movable cover portions lift in the first direction relative to the second through holes, so as to push air in the first air cavity out through the outlet and draw in external air into the second air cavity from the inlet, and
when the vibrating part moves in a second direction opposite to the first direction toward the second air cavity, the first central connection portion of the first cover film and at least the central portion of the frame sheet move in the second direction, so that the first movable cover portions lift in the first direction relative to the first through holes and the second movable cover portions seal the second through holes, so as to make at least a portion of the external air be pushed into the first air cavity from the second air cavity.

2. The air flow generating device of claim 1, wherein the lower support is a membrane.

3. An air flow generating device, comprising:
an enclosing wall forming an air flow passage, the air flow passage having an inlet and an outlet;
a frame sheet disposed in the air flow passage and having a plurality of first through holes, a periphery of the frame sheet closely contacting the enclosing wall, the frame sheet partitioning the air flow passage into a first air cavity connecting with the outlet, and a second air cavity connecting with the inlet;
a first cover film comprising a first central connection portion and a plurality of first movable cover portions connected to the first central connection portion, the first cover film being located between the frame sheet and the outlet, the first central connection portion being fixed on a central portion of the frame sheet, the first movable cover portions selectively covering the first through holes;

an upper support fixedly connected to the enclosing wall and located at the outlet, the upper support having a plurality of third through holes;

a third cover film comprising a third central connection portion and a plurality of third movable cover portions connected to the third central connection portion, the upper support being located between the third cover film and the first cover film, the third central connection portion being fixed on a central portion of the upper support, the third movable cover portions selectively covering the third through holes; and a vibrating part fixedly connected to the frame sheet and being capable of repetitively moving;

wherein, when the vibrating part moves in a first direction toward the first air cavity, the first central connection portion of the first cover film and at least the central portion of the frame sheet move in the first direction, so that the first movable cover portions seal the first through holes and the third movable cover portions lift in the first direction relative to the third through holes, so as to push air in the first air cavity out through the outlet and draw in external air into the second air cavity from the inlet, and when the vibrating part moves in a second direction opposite to the first direction toward the second air cavity, the first central connection portion of the first cover film and at least the central portion of the frame sheet move in the second direction, so that the first movable cover portions lift in the first direction relative to the first through holes and the third movable cover portions seal the third through holes, so as to make at least a portion of the external air be drawn into the first air cavity from the second air cavity.

4. The air flow generating device of claim 3, wherein the upper support is a membrane.

5. The air flow generating device of claim 3, further comprising a lower support and a second cover film, wherein the lower support is fixedly connected to the enclosing wall and located at the inlet, the lower support has a plurality of second through holes, the second cover film comprises a second central connection portion and a plurality second movable cover portions connected to the second central connection portion, the second cover film is located between the lower support and the frame sheet, the second central connection portion is fixed on a central portion of the lower support, the second movable cover portions selectively cover the second through holes, when the vibrating part moves in the first direction toward the first air cavity, the first central connection portion of the first cover film and at least the central portion of the frame sheet move in the first direction, so that the second movable cover portions lift in the first direction lift relative to the second through holes to draw the external air into the second air cavity, and when the vibrating part moves in the second direction toward the second air cavity, the first central connection portion of the first cover film and at least the central portion of the frame sheet move in the second direction, so that the second movable cover portions seal the second through holes so as to make the external air drawn into the second air cavity be pushed into first air cavity.

6. The air flow generating device of claim 3, further comprising an upper spring and a lower spring, wherein the upper spring is disposed between the frame sheet and the upper support, the lower spring is disposed between the frame sheet and the lower support, and when the vibrating part vibrates, the upper spring and the lower spring are elastically deformable.

* * * * *